(12) United States Patent
Fukuda et al.

(10) Patent No.: US 7,582,944 B2
(45) Date of Patent: Sep. 1, 2009

(54) OPTICAL APPARATUS AND OPTICAL MODULE USING THE SAME

(75) Inventors: Toshiyuki Fukuda, Kyoto (JP); Yoshiki Takayama, Shiga (JP); Masanori Minamio, Osaka (JP); Tetsushi Nishio, Kyoto (JP); Yutaka Harada, Kyoto (JP)

(73) Assignee: Panasonic Corporation, Osaka (JP)

( * ) Notice: Subject to any disclaimer, the term of this patent is extended or adjusted under 35 U.S.C. 154(b) by 308 days.

(21) Appl. No.: 11/698,100

(22) Filed: Jan. 26, 2007

(65) Prior Publication Data

US 2007/0252227 A1 Nov. 1, 2007

(30) Foreign Application Priority Data

Apr. 28, 2006 (JP) .............................. 2006-126610

(51) Int. Cl.
*H01L 31/0232* (2006.01)
(52) U.S. Cl. ..................... 257/432; 257/434; 257/459; 257/680; 257/E27.13; 257/294
(58) Field of Classification Search ................ 257/432, 257/E27.13, 434, 459, 680, 294
See application file for complete search history.

(56) References Cited

U.S. PATENT DOCUMENTS 5,359,190 A * 10/1994 O'Regan et al. ............ 250/216

2004/0084741 A1 * 5/2004 Boon et al. .................. 257/433
2006/0138480 A1 * 6/2006 Adkisson et al. ............ 257/291

FOREIGN PATENT DOCUMENTS

| JP | 63-242072 | 10/1988 |
| JP | 9-17986 | 1/1997 |

* cited by examiner

Primary Examiner—Tu-Tu V Ho
(74) Attorney, Agent, or Firm—McDermott Will & Emery LLP

(57) ABSTRACT

An optical apparatus includes an optical device (LED device or semiconductor imaging device) having a photoreceptor/light-emitting region, a peripheral circuit region and an electrode region, a transparent member having a larger light passing through region than the optical device and including, on one surface thereof, protruding electrodes for connection to the optical device, external connection electrodes for connection to a mounting substrate, conductive interconnects for connecting the protruding electrodes and the external connection electrodes, and a transparent adhesive provided between the optical device and the transparent member. In the optical apparatus, one surface of the optical device in which the photoreceptor/light-emitting region is formed and one surface of the transparent member are arrange so as to face to each other and electrodes of the optical device and the protruding electrodes of the transparent member are electrically connected and also adhered by the transparent adhesive.

19 Claims, 11 Drawing Sheets

OPTICAL APPARATUS AND OPTICAL MODULE USING THE SAME

CROSS REFERENCE TO RELATED APPLICATIONS

The disclosure of Japanese Patent Application No. 2006-126610 filed on Apr. 28, 2006 including specification, drawings and claims are incorporated herein by reference in its entirety.

BACKGROUND OF THE INVENTION

The present invention relates to a structure of an optical module in which an optical apparatus including an optical device, specifically, a LED or a semiconductor imaging device, is mounted on a mounting substrate by a flip chip manner.

Conventionally, an optical apparatus, specifically, a LED apparatus or a semiconductor imaging apparatus, having a structure in which a transparent member is directly adhered to an optical device, includes an optical device (such as a LED or a semiconductor imaging device) in which a plurality of protruding electrodes are formed in the periphery of an effective light emitting region or imaging region and an optical glass plate (i.e., a transparent member) on which an interconnect pattern is formed.

When the optical device is a semiconductor imaging device, the optical device has one surface including an imaging region. In the imaging region, a center portion is defined as an effective imaging region and part of the imaging region located around the effective imaging region is defined as a peripheral region. The peripheral region of the semiconductor imaging device is adhered to an interconnect pattern formation surface of the optical glass plate with an adhesion material interposed therebetween. One end of the interconnect pattern is electrically connected to an associated one of the protruding electrodes provided on the optical device. The other end of the interconnect pattern serves as an external connection electrode. For the purpose of shielding light, a structure in which as the adhesion material, a material containing a black pigment is used, a structure in which an anisotropic conductive material is used, and a structure in which a half-hardened adhesion material is used have been disclosed (see, for example, Japanese Laid-Open Publication No. 9-17986).

Another optical apparatus having a structure in which a transparent substrate is directly adhered to an optical device has been disclosed. The optical apparatus implemented as a semiconductor imaging apparatus includes an optical device (such as a LED and a semiconductor imaging device), an optical glass arranged so as to face a principal surface of the optical device, a conductive member interposed between the optical device and the optical glass and electrically connecting an electrode of the optical device and an electrode interconnect portion provided on the optical glass, and a transparent member provided between the optical device and the optical glass so as to cover the principal surface of the optical device. The optical apparatus and an interconnect substrate are electrically connected to form a module. The electrical connection is created by the electrode interconnect portion provided on the optical glass and an interconnect layer formed on one surface of the interconnect substrate (see, for example, Japanese Laid-Open Publication No. 63-242072).

SUMMARY OF THE INVENTION

However, in the structures of the known optical apparatus, one end of the interconnect pattern on the optical glass plate and an optical device are connected to each other by a flip chip method, and protruding electrodes for creating such connection are formed on the optical device. For example, when the protruding electrodes are formed on electrodes of the optical device, respectively, by electroplating or electroless plating, defects due to failures such as a short circuit between electrodes in plating, deformation of plating or the like, poor connection strength at an interface between aluminum and the protruding electrodes and the like tend to occur.

Accordingly, a yield is reduced when an optical device is formed. Moreover, in a structure in which a space between an optical glass plate and an optical device is filled with an adhesion material to seal part of the optical device other than a photoreceptor surface thereof, there are many cases there the adhesion material tends to go out into the photoreceptor surface when one end of an interconnect pattern provided on the optical glass plate and a protruding electrode on the optical device are connected. Accordingly, a yield is reduced in many cases.

Moreover, in a structure of such a known optical module, a through hole is formed in an interconnect substrate to which an optical apparatus is connected and light comes into and out from the optical device through the through hole. When an optical apparatus is connected to the interconnect substrate, an interconnect can not be provided on a back surface of the interconnect substrate. This prevents increase in density of optical modules. Furthermore, if an optical apparatus is kept connected to an interconnect substrate, light enters the optical device from back of a through hole, resulting in degradation of optical characteristics of an optical module. Therefore, a structure in which a through hole is filled with a light shielding resin from a back surface of an interconnect substrate is preferably used. However, there are problems in which fabrication process steps are complicated and a component count is too large to reduce costs.

To solve the above-described known problems, the present invention has been devised and it is therefore an object of the present invention to provide a light, thin and small optical apparatus and optical module.

To solve the above-described known problems, an optical apparatus according to the present invention includes: an optical device including a photoreceptor region or a light emitting region and electrodes provided on an optical function surface; a transparent member having an adhesion surface having a larger area than an area of the optical function surface and including protruding electrodes electrically connected to the optical device, external connection electrodes and conductive interconnects for connecting the protruding electrodes and the external connection electrodes, respectively; and a transparent adhesive provided between the optical device and the transparent member to adhere the optical device and the transparent member to each other. In the optical apparatus, the optical function surface of the optical device and the adhesive surface of the transparent member face each other, and the electrodes and the protruding electrodes are electrically connected, respectively, and the electrical connection is maintained by the transparent adhesive.

In this structure, protruding electrodes for connecting the transparent member and the optical device (such as a LED device and a semiconductor imaging device) are provided on the conductive interconnects located on the transparent member. Thus, the step of forming protruding electrodes on the optical device (such as a LED device and a semiconductor imaging device) is not necessary. As a result, the optical device (such as a LED device and a semiconductor imaging device) is not immersed in a plating solution for forming protruding electrodes, so that reduction in yield and quality of the optical apparatus due to change in electrical characteristics caused by heavy metal contamination, insufficiently cleansing after plating or the like, corrosion of a bonding pad portion and the like can be prevented. Furthermore, an adhesion member (i.e., the transparent adhesive) for connecting the transparent member and the optical device (such as a LED device and a semiconductor imaging device) is applied to the entire imaging region of the optical device (such as a LED device and a semiconductor imaging device). Accordingly, control of the amount of the adhesion member (i.e., the transparent adhesive) flowing into the photoreceptor/light-emitting region becomes not necessary. As a result, a high-quality, light, thin and small optical apparatus can be achieved with a high yield.

A loop shape groove may formed in the adhesive surface of the transparent member so as to surround part of the adhesive surface corresponding to a circumference of the optical device, and the conductive interconnects may be formed so that each said conductive interconnect crosses the loop shape groove. Alternatively, a loop shape groove may be formed in the adhesive surface of the transparent member so as to surround part of the adhesive surface corresponding to a circumference of the optical device, and a light shielding material may be filled in the loop shape groove. Moreover, the loop shape groove may have a smaller width at a bottom portion than at an opening potion and each side wall of the loop shape groove extending from the opening portion to the bottom portion may have a slope shape or a step-like shape.

In this structure, flow-out of the transparent adhesive which is filled into a space between the transparent member and the optical device (such as a LED device and a semiconductor imaging device) adhered to each other to the outside of the adhesion region can be prevented. Moreover, optical noise which enters or is output from the transparent member at an angle can be shielded.

Moreover, grooves may be provided in the adhesion surface of the transparent member so that each said groove has an opening having a similar shape to the shape of each said conductive interconnect and a larger size than a size of each said conductive interconnect, and the conductive interconnects may be formed so as to be provided in the grooves, respectively.

In this structure, the conductive interconnects provided on the surface of the transparent member can be arranged so that each of the conductive interconnects is provided in an associated one of the grooves. Accordingly, the conductive interconnects can be kept from being in contact with other members or a production tool during fabrication process steps, so that a flaw and disconnection of the conductive interconnects due to the connection can be prevented. Therefore, the optical apparatus can be produced with a high yield.

In the above-described structure, the optical apparatus may further include, on an opposite surface of the transparent member to the adhesive surface, a lens module including a lens holder and a lens attached to the lens holder, and an optical axis of the lens may substantially match with an optical axis of the photoreceptor region or the light emitting region of the optical device. Herein, "to substantially match" means to match in terms of an assembly precision range, which substantially does not cause harmful effects.

With this structure, even if the lens module is arranged in the optical apparatus, a thin optical apparatus which can be mounted on electric equipment can be achieved. Furthermore, if a glass substrate is used as the transparent member, an excellent flat surface can be ensured in a simple manner, so that adjustment in installing the lens module can be performed in a simple manner with high accuracy. Accordingly, adjustment after the installation becomes not necessary, so that fabrication process steps can be largely simplified.

Furthermore, an optical module according to the present invention includes: the above-described optical apparatus; and a first mounting substrate on which the optical apparatus is mounted, and the first mounting substrate includes a first substrate. In the optical module, a recess portion having a larger area than an area of the optical device and a larger depth than a thickness of the optical device, first substrate terminals arranged around the recess portion and first substrate interconnects for electrically connecting the first substrate terminals to an external circuit are provided on one surface of the first substrate, at least part of the optical device is inserted in the recess portion, and the first substrate terminals are arranged so as to correspond to the external connection electrodes, respectively, and are connected to the external connection electrodes, respectively.

With this structure, a light, thin and small optical module having an excellent optical noise resistance to light which enters from a back surface of the first mounting substrate can be achieved. Furthermore, assuming that an optical apparatus to which a lens module is attached is used, even if the optical apparatus is mounted on a mounting substrate, the optical module having a very thin module structure can be achieved.

Moreover, another optical module according to the present invention includes: an optical device to which a lens module is attached; and a first mounting substrate on which the optical device is mounted. In the first mounting substrate, an opening portion which is at least larger than a semiconductor imaging device (such as a LED device and a semiconductor imaging device) is formed in a first substrate, first substrate terminals arranged around the opening portion so as to correspond to protruding electrodes of the semiconductor imaging device, respectively, and first substrate interconnects each of which connects an associated one of the first substrate terminals and an external circuit section are provided, and each of the external connection electrodes of the optical device is adhered to an associated one of the first substrate terminals of the first mounting substrate.

With this structure, in the case where the optical apparatus to which the lens module is attached is used, even if the optical apparatus is mounted on a mounting substrate, a very thin module structure can be achieved. Moreover, this structure can be obtained by only providing the opening portion on the mounting substrate and thus the mounting substrate can be formed in a simple manner.

Another optical apparatus according to the present invention includes: an optical device including a photoreceptor region or a light emitting region and electrodes provided on an optical function surface; a transparent member having an adhesion surface having a larger area than an area of the optical function surface and including protruding electrodes electrically connected to the optical device, external connection electrodes and conductive interconnects for connecting the protruding electrodes and the external connection electrodes, respectively; and a transparent adhesive provided between the optical device and the transparent member to adhere the optical device and the transparent member to each other. In the transparent member, the protruding electrodes, the external connection electrodes and the conductive interconnects are provided on one surface of the transparent member, and the transparent member further includes, on the other surface, back surface electrodes electrically connected to the external connection electrodes via through electrodes provided in the transparent substrate so as to pass through the transparent substrate, respectively, the optical function surface of the optical device and the adhesive surface of the transparent member face to each other, and the electrodes and the protruding electrodes are electrically connected, respectively, and the electrical connection is maintained by the transparent adhesive.

In this structure, the mounting substrates can be arranged with the optical apparatus including the optical device (such as a LED device and a semiconductor imaging device) centered between the mounting substrates. Accordingly, when an optical module is fabricated using the optical apparatus, a high performance and high density semiconductor imaging module can be achieved. Moreover, the degree of design freedom of the optical module is increased.

A loop shape groove may be formed in the adhesive surface of the transparent member so as to surround part of the adhesive surface corresponding to a circumference of the optical device, and the conductive interconnects may be formed so that each said conductive interconnect crosses the loop shape groove. Alternatively, a loop shape groove may be formed in the adhesive surface of the transparent member so as to surround part of the adhesive surface corresponding to a circumference of the optical device, and a light shielding material may be filled in the loop shape groove. The loop shape groove may have a smaller width at a bottom portion than at an opening potion and each side wall of the groove extending from the opening portion to the bottom portion may have a slope shape or a step-like shape.

In this structure, flow-out of the transparent adhesive which is filled into a space between the transparent member and the optical device (such as a LED device and a semiconductor imaging device) adhered to each other to the outside of the adhesion region can be prevented. Moreover, optical noise which enters or is output from the transparent member at an angle can be shielded.

Moreover, grooves may be provided in the adhesion surface of the transparent member so that each said groove has an opening having a similar shape to the shape of each said conductive interconnect and a larger size than a size of each said conductive interconnect, and the conductive interconnects may be formed so as to be provided in the grooves, respectively.

In this structure, the conductive interconnects provided on the surface of the transparent member can be arranged so that each of the conductive interconnects is provided in an associated one of the grooves. Accordingly, the conductive interconnects can be kept from being in contact with other members or a production tool during fabrication process steps, so that a flaw and disconnection of the conductive interconnects due to the connection can be prevented. Therefore, the optical apparatus can be produced at a high yield.

Another optical module according to the present invention includes: the above-described optical apparatus; a first mounting substrate on which the optical apparatus is mounted, the first mounting substrate including a first substrate; and a second mounting substrate arranged so as to face the first mounting substrate with the optical apparatus interposed therebetween, the second mounting substrate including a second substrate. In the first substrate, a recess portion having a larger area than an area of the optical device and a larger depth than a thickness of the optical device, first substrate terminals arranged around the recess portion and first substrate interconnects for electrically connecting the first substrate terminals to an external circuit are provided on one surface of the first substrate, at least part of the optical device is inserted in the recess portion, and the first substrate terminals are arranged so as to correspond to the external connection electrodes, respectively, and are connected to the external connection electrodes, respectively. In the second substrate, a through opening having an area equal to or larger than an area of the photoreceptor region or the light emitting region of the optical device, second substrate terminals arranged around the through opening and second substrate interconnects for electrically connecting the second substrate terminals to an external circuit are provided, a frame of the through opening is located so as to correspond to a circumference of the photoreceptor region or the light emitting region or the outside of the circumference in the optical device, and the substrate terminals are arranged so as to correspond to the back surface electrodes, respectively, and are connected to the back surface electrodes, respectively. Herein, "a frame of the through opening is located so as to correspond to a circumference of the photoreceptor region or the light emitting region or the outside of the circumference" means that a frame of the through opening is located directly above a circumference of the photoreceptor region or the light emitting region or the outside of the circumference and, as a result, light passing through the through opening enters the entire photoreceptor region or light output from the light emitting region goes out through the through opening without being shielded by the second member.

In this structure, the mounting substrates can be arranged with the optical apparatus centered between the mounting substrates. Accordingly, a high performance and high density optical module can be achieved. Moreover, the degree of design freedom of the optical module is increased.

In this case, the second substrate of the second mounting substrate may be formed of a flexible material. With this structure, the second mounting substrate can be placed so as to be piled above the first mounting substrate or folded. Thus, an optical module which can be stored in various different spaces can be achieved.

DESCRIPTION OF THE PREFERRED EMBODIMENTS

Hereafter, preferred embodiments of the present invention will be described with reference to the accompanying drawings. In each embodiment, the present invention is implemented as a semiconductor imaging device, a semiconductor imaging apparatus and a semiconductor imaging module. However, needless to say, the present invention is applicable to so-called optical device, optical apparatus and optical module. An optical device means to be a photoreceptor such as an image sensor or a light emitting device such as a LED.

For convenience of preparing the drawings, a thickness, a length and the like of each component are drawn different from actual thickness, length and like dimension of the component in the accompanying drawings. Moreover, for convenience of illustration, the numbers of electrodes and terminals of each component are different from actual numbers. Furthermore, a material for each component is not limited to materials which will be described blow.

First Embodiment

Figure 1:
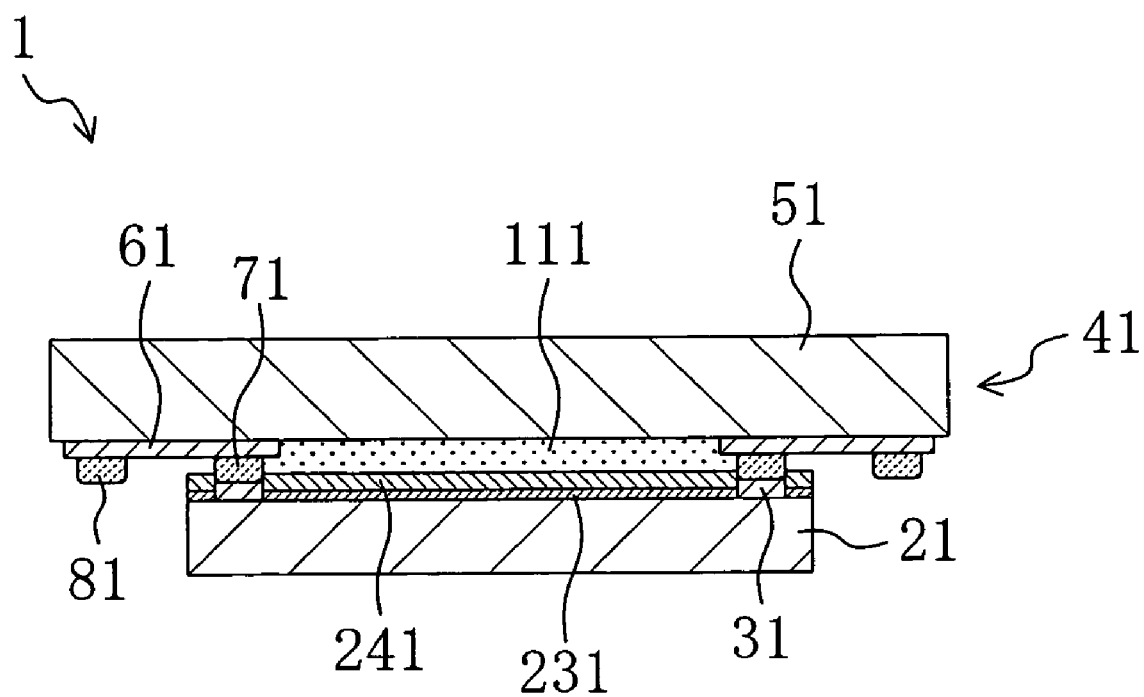
FIG. 1 is a cross-sectional view of a semiconductor imaging apparatus according to a first embodiment of the present invention.

FIG. 1 is a cross-sectional view of a semiconductor imaging apparatus (optical apparatus) 1 according to a first embodiment of the present invention. The semiconductor imaging apparatus 1 of FIG. 1 includes a transparent member 41, a semiconductor imaging device (optical device) 21 and a transparent adhesive 111.

Figure 16:
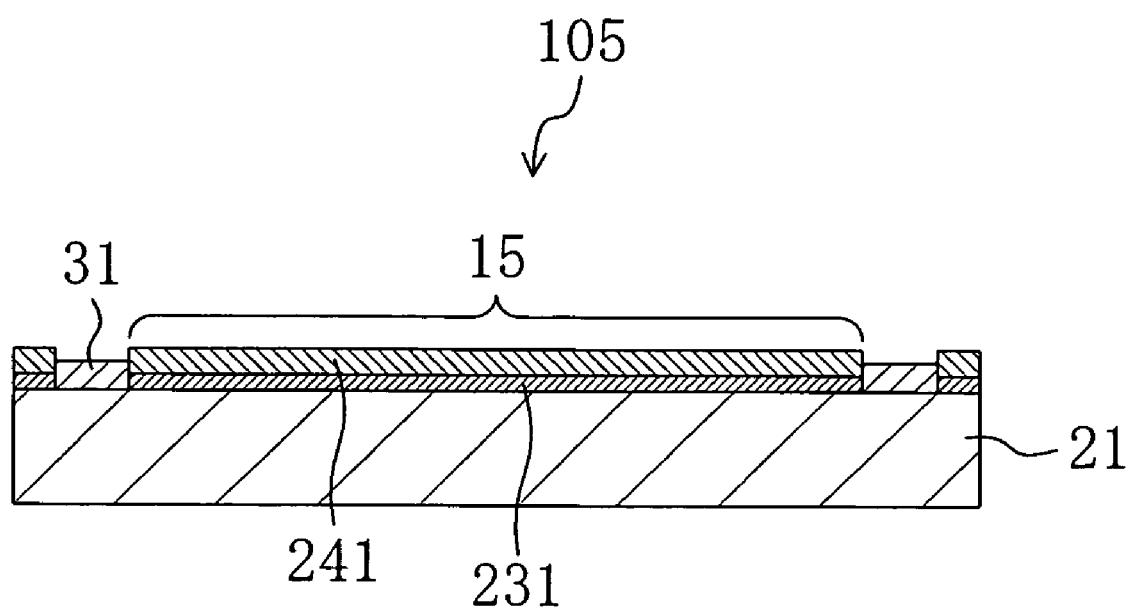
FIG. 16 is a cross-sectional view of a semiconductor imaging device.

As shown in FIG. 16, the semiconductor imaging device 21 is formed so that its principal surface (optical function surface 105) includes an imaging region (photoreceptor region) 15, a peripheral circuit region and an electrode region and a microlens is formed on each pixel in the imaging region. The peripheral circuit region, the electrode region and the microlens are not shown in FIG. 16. Over the microlens, a laminated organic film of a transparent low-refractive index film 231 and a flattering film 241 is formed so as to entirely cover the principal surface except for electrodes 31 located in the electrode region. These films may be formed only in the imaging region 15. For example, a nickel film or a lamination film of nickel and gold is formed on a surface of each of the electrodes 31 made of, for example, aluminum, copper or the like by electroless plating or like method. The surface of each of the electrodes 31 does not have to be covered by nickel or the like as described above, but may be maintained to be aluminum or copper.

The transparent adhesive 111 is made of liquid or half-hardened transparent resin having the characteristic of being hardened when being exposed to ultraviolet light or the characteristic of being hardened when being exposed to heat. As the transparent resin, any one of epoxy resin, acrylic resin and polyimide resin can be used. The material for the transparent adhesive 111 is not limited those materials but a material having transparency and adhesiveness can be used.

In the semiconductor imaging apparatus 1 of this embodiment, each of the protruding electrodes 71 formed on one surface of a transparent substrate 51 constituting a transparent member 41 and an associated one of electrodes 31 of the semiconductor imaging device 21 are in contact with one another to make electrical connection, and the semiconductor imaging device 21 and the transparent member 41 are adhered and fixed to each other by the transparent adhesive 111 filled in a space between the transparent substrate 51 and the semiconductor imaging device 21. Each of the protruding electrodes 71 is provided on an associated one of conductive interconnects 61 formed on the same surface of the transparent substrate 51 as the protruding electrodes 71 are formed. Specifically, after application of the transparent adhesive 111 to the entire principal surface of the semiconductor imaging device 21, electrical connection between the protruding electrodes 71, the semiconductor imaging device 21 and the electrodes 31 is created under the condition where the protruding electrodes 71, the semiconductor imaging device 21 and the electrodes 31 are aligned and a pressure is applied thereto, and is maintained by irradiating ultraviolet light to the transparent adhesive 111 from an upper surface of the transparent substrate 51 (i.e., a surface on which the conductive interconnects 61 are not formed to harden the transparent adhesive 111). Through this hardening, the transparent substrate 51 and the semiconductor imaging device 21 can be adhered to each other. Furthermore, after irradiation of ultraviolet light, the transparent adhesive 111 may be heated to accelerate hardening. Also, after the protruding electrodes 71 and the electrodes 31 have been aligned, the transparent adhesive 111 may be filled while pressure is applied thereto and then, in this condition, ultraviolet light may be irradiated to the transparent adhesive 111 to harden the transparent adhesive 111.

On each of the conductive interconnects 61 arranged on the transparent substrate 51, an associated one of the protruding electrodes 71 and the semiconductor imaging device 21 may be adhered by a conductive adhesive or soldered connection method, an ultrasound connection method, or like method. Moreover, external connection electrodes 81 are provided on the conductive interconnects 61, respectively, so that each of the external connection electrodes 81 is located in different part thereof on which an associated one of the protruding electrodes 71 is provided.

With the above-described structure, the light, thin and small semiconductor imaging apparatus 1 can be achieved.

Figure 2A:
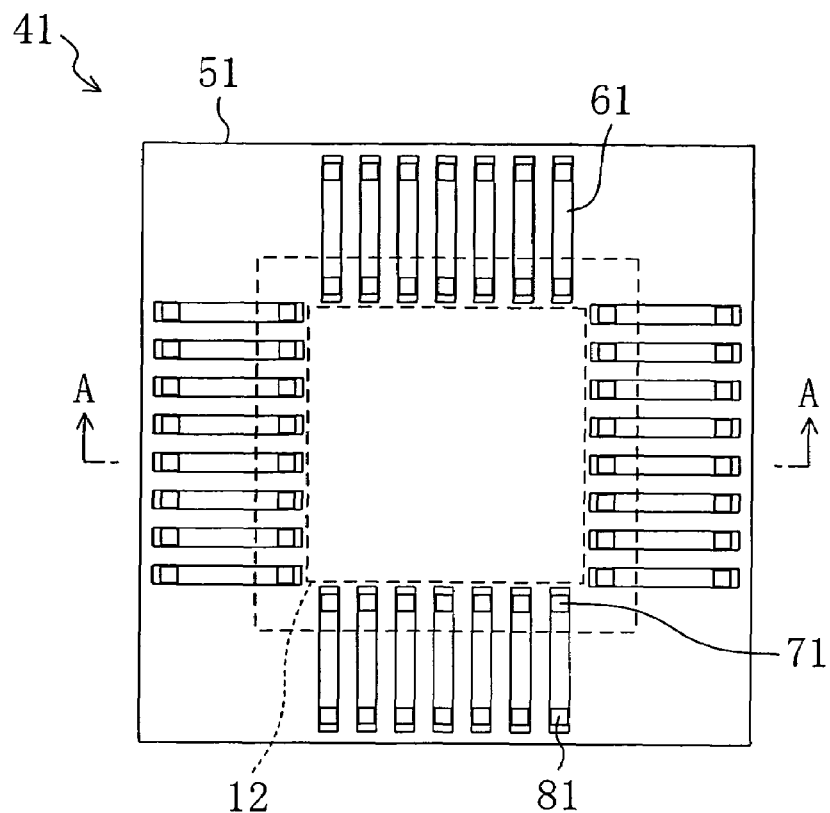
FIG. 2A is a plan view of a transparent member constituting the semiconductor imaging apparatus of the first embodiment and FIG. 2B is a cross-sectional view taken along the line A-A of FIG. 2A.
Figure 2B:
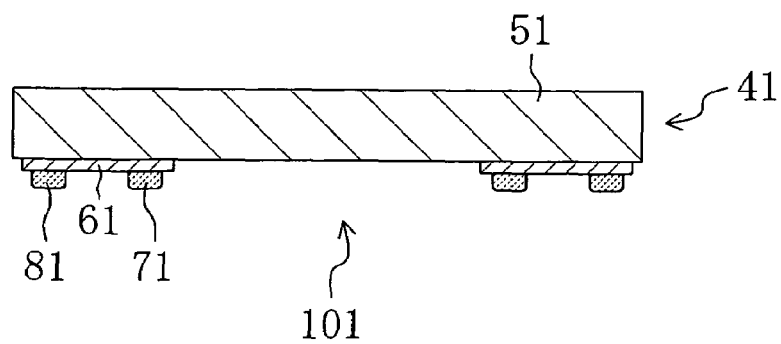

FIGS. 2A and 2B are views illustrating the transparent member 41 constituting the semiconductor imaging apparatus 1 of this embodiment. FIG. 2A is a plan view of the transparent member 41. FIG. 2B is a cross-sectional view taken along the line A-A of FIG. 2A. The transparent member 41 shown in FIG. 1 and FIGS. 2A and 2B includes a transparent substrate 51 of which a projection plane has a rectangular shape, conductive interconnects 61, protruding electrodes 71 and external connection electrodes 81. The protruding electrodes 71 and the external connection electrodes 81 are arranged so that each of the protruding electrodes 71 and an associated one of the external connection electrodes 81 are located on both sides of an upper surface of each of the conductive interconnects 61. The projection plane means to be an upper surface (on which the conductive interconnects 61 are not formed) of the transparent substrate 51. The reference numeral 101 denotes an adhesion surface.

The transparent member 41 includes the plurality of conductive interconnects 61 each of which has a narrow rectangular shape on one surface of the transparent substrate 51. Furthermore, each of the protruding electrodes 71 provided on an upper surface of one end portion of an associated one of the conductive interconnects 61 is arranged so as to correspond to an associated one of electrodes 31 of the semiconductor imaging device 21 when the semiconductor imaging device 21 is arranged so as to face an interconnect formation surface of the transparent substrate 51. Each of the external connection electrodes 81 is provided so as to be on the other end portion of an associated one of the conductive interconnects 61 and the external connection electrodes 81 are arranged around a circumference region of the transparent substrate 51 with a predetermined distance from adjacent ones of the external connection electrodes 81. The area of projection plane of the transparent substrate 51 is at least larger than the semiconductor imaging device 21. The protruding electrodes 71 and the external connection electrodes 81 are formed so that all of the protruding electrodes 71 have the same height and the all of the external connection electrodes 81 have the same height. The protruding electrodes 71 and the external connection electrodes 81 may have the same height or different heights.

In the transparent substrate 51, a light passing through region 12 is formed in a center portion thereof. The light passing through region 12 has a larger area than a photoreceptor region of the semiconductor imaging device 21. When the transparent member 41 is provided in the semiconductor imaging apparatus 1, the light passing through region 12 is located immediately above the semiconductor imaging device 21 so as to entirely cover the photoreceptor region of the semiconductor imaging device 21. Specifically, the light passing through region 12 is a region of the transparent substrate 51 surrounded by the protruding electrodes 71 or, in other words, a region of the transparent substrate 51 defined by lines connecting center side edges of the conductive interconnects 61. Note that in FIG. 2, in order to make the view easier to see, the light passing through region 12 is drawn smaller than an actual look in the region.

As a material for the transparent substrate 51, any one of a hard glass such as Pyrex glass, Terex glass, or the like, quartz, alumina glass, epoxy resin, acrylic resin, polyimide resin and the like may be used as long as the material is at least transparent to visible light. Moreover, in general, the conductive interconnects 61 are formed by vapor deposition, plating, printing or the like. A material for interconnects of a circuit substrate and the like which is usually used can be used without particular constraints. For example, a single body structure of copper, nickel, gold, aluminum or the like or a laminated structure of these materials can be used. Moreover, in general, the protruding electrodes 71 and the external connection electrodes 81 are formed by a plating or wire bump method. As materials for the protruding electrodes 71 and the external connection electrodes 81, for example, gold, copper, or copper having a thin gold film on its surface can be used. However, materials and formation methods for the protruding electrodes 71 and the external connection electrodes 81 are not limited those materials and methods described above.

Second Embodiment

Figure 3A:
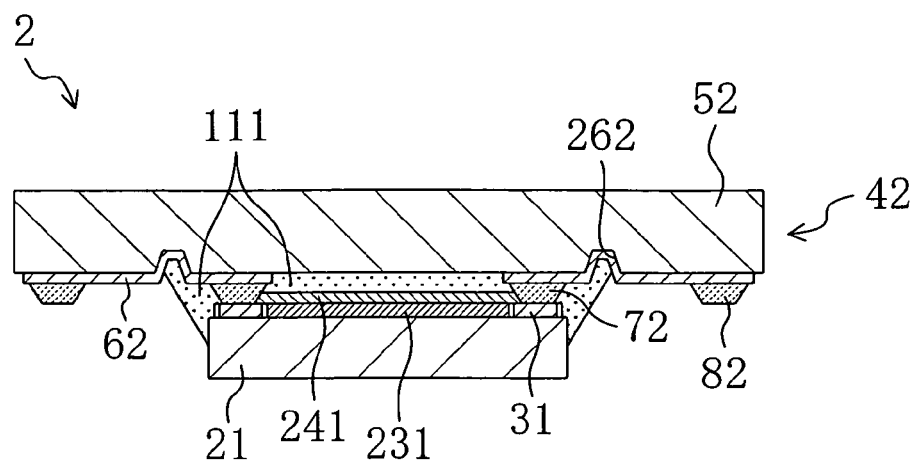
FIG. 3A is a cross-sectional view of a semiconductor imaging device according to a second embodiment of the present invention and FIG. 3B is a partial cross-sectional view of the semiconductor imaging apparatus using a step-like shape groove, instead of a slope shape groove.
Figure 3B:
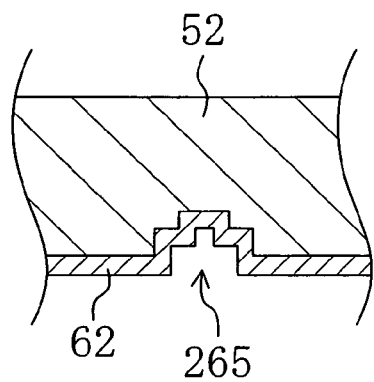

FIGS. 3A and 3B illustrate a cross-sectional view of a semiconductor imaging apparatus 2 according to a second embodiment of the present invention. The semiconductor imaging apparatus 2 shown in FIGS. 3A and 3B is characterized in that the a transparent member 42 having a different shape from that of the transparent member in the semiconductor imaging apparatus 1 of the first embodiment is provided. Other part has the same structure as that of the first embodiment. Specifically, the semiconductor imaging apparatus 2 includes the transparent member 42 having a shape described as follows. The transparent member 42 includes a transparent substrate 52, conductive interconnects 62, protruding electrodes 72 and external connection electrodes 82. The transparent substrate 52 includes a loop shape groove 262 extending around a center region of the transparent substrate 52 in which a semiconductor imaging device 21 is mounted. The protruding electrodes 72 and the external connection electrodes 82 are arranged so that each of the protruding electrodes 72 and an associated one of the external connection electrodes 82 are located on both end portions of an associated one of the conductive interconnects 62, respectively.

The loop shape groove 262 is provided in one surface of the transparent substrate 52 so that each side wall of the loop shape groove 262 has a slope shape. Specifically, an opening width of the loop shape groove 262 is larger than a width of a bottom portion thereof and each side wall extending from the opening portion to the bottom portion has a slope shape, as shown in the cross-sectional view shown in FIG. 3A. In another example shown in FIG. 3B, each side wall of a loop shape groove 265 may have a step-like shape. The conductive interconnects 62 are formed so that each of the conductive interconnects 62 crosses the loop shape groove 262 and covers parts of inner walls of the loop shape groove 262 at a junction point with the loop shape groove 262.

In the semiconductor imaging apparatus 2 of this embodiment, even if the transparent adhesive 111 goes out of a space between the semiconductor imaging device 21 and the transparent member 42, the transparent adhesive 111 flows into the loop shape groove 262 and is stopped in the loop shape groove 262. Accordingly, in the semiconductor imaging apparatus 2, even when the external connection electrode 82 is arranged in the vicinity of a semiconductor imaging device 22, the transparent adhesive 111 does not adhere to the external connection electrode 82. Other than that, according to the second embodiment, the same effects as those of the first embodiment can be achieved. Therefore, a yield in fabricating a semiconductor imaging module can be improved and a size of the entire module can be reduced furthermore.

Third Embodiment

Figure 4A:
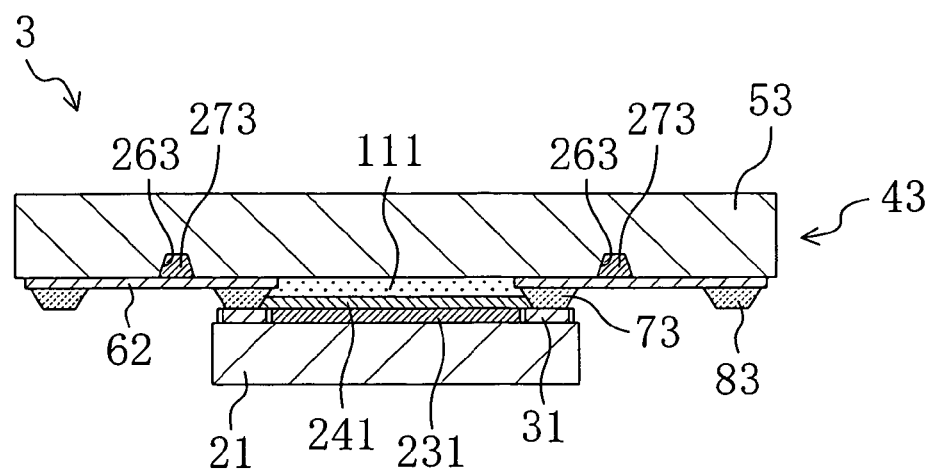
FIG. 4A is a cross-sectional view of a semiconductor imaging device according to a third embodiment of the present invention and FIG. 4B is a partial cross-sectional view of the semiconductor imaging apparatus using a step-like shape groove, instead of a slope shape groove.
Figure 4B:
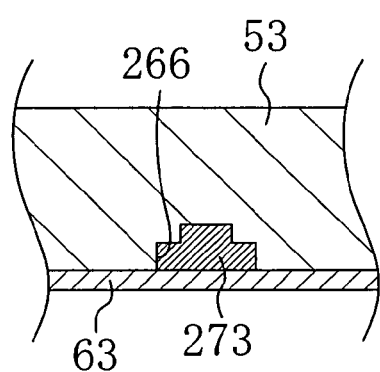

FIGS. 4A and 4B are cross-sectional views illustrating a semiconductor imaging apparatus 3 according to a third embodiment of the present invention. The semiconductor imaging apparatus 3 shown in FIGS. 4A and 4B is characterized in that a transparent member 43 having part in which a light shielding agent 273 is filled is provided, instead of the transparent member 41 used in the semiconductor imaging apparatus 1 of the first embodiment. Other part has the same structure as that of the first embodiment. Specifically, the semiconductor imaging apparatus 3 includes the transparent member 43, a semiconductor imaging device 21 and a transparent adhesive 111. The transparent member 43 includes a transparent substrate 53, conductive interconnects 63, protruding electrodes 73 and external connection electrodes 83. The transparent substrate 53 has a rectangular shape projection plane and includes a loop shape groove 263. The loop shape groove 263 is filled with a light shielding agent 273 in advance. The protruding electrodes 73 and the external connection electrodes 83 are arranged so that each of the protruding electrodes 73 and an associated one of the external connection electrodes 83 are located on both end portions of an associated one of the conductive interconnects 63, respectively.

In the transparent member 43, the loop shape groove 263 is formed in one surface of the transparent substrate 53 so as to extend along a circumference of the semiconductor imaging device 21 mounted on the same surface of the transparent substrate 53. Each side wall of the loop shape groove 263 has a slope shape. A light shielding agent 273 containing a substance such as a black pigment and the like which has a light shielding characteristic is filled in the loop shape groove 263. Specifically, an opening width of the loop shape groove 263 is larger than a width of a bottom portion thereof, so that line indicating each side wall has a slope and connects the opening and the bottom portion in the cross-sectional view shown in FIG. 4A. As in another example shown in FIG. 4B, each side wall of a loop shape groove 266 may have a step-like shape. The conductive interconnects 63 are formed so that each of the conductive interconnects 63 crosses the loop shape groove 263 and covers part of an upper surface of the loop shape groove 263 at a junction point with the loop shape groove 263. Note that before filling the loop shape groove 263 with the light shielding agent 273, as the transparent member 42 in the second embodiment, the conductive interconnects 63 may be formed so that each of the conductive interconnects 63 crosses the loop shape groove 263 and covers parts of inner walls of the loop shape groove 263 at a junction point with the loop shape groove 263 and then the light shielding agent 273 may be filled thereinto.

With the above-described structure, a flare can be prevented in a simple manner. Moreover, as the semiconductor imaging apparatus 1 of the first embodiment, the light, thin and small semiconductor imaging apparatus 3 can be achieved.

Fourth Embodiment

Figure 5:
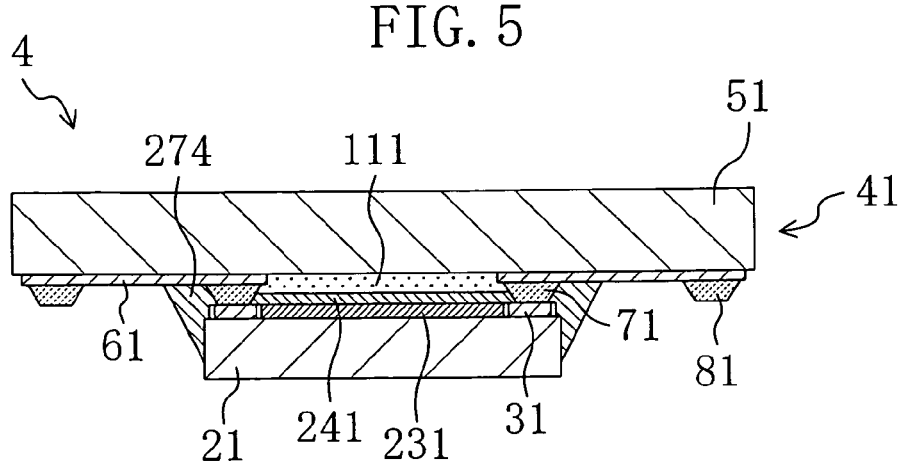
FIG. 5 is a cross-sectional view of a semiconductor imaging apparatus according to a fourth embodiment of the present invention.

FIG. 5 is a cross-sectional view of a semiconductor imaging apparatus 4 according to a fourth embodiment of the present invention. The semiconductor imaging apparatus 4 of FIG. 5 is characterized in that a light shielding agent 274 is provided so as to surround part of a side wall of the semiconductor imaging device 21 located closer to an imaging plane and adhesion part for connecting the semiconductor imaging device 21 and the transparent member 41. Other part has the same structure as that of the first embodiment. That is, the semiconductor imaging apparatus 4 includes a transparent member 41, the semiconductor imaging device 21, the transparent adhesive 111 and the light shielding agent 274. Structures and materials of the transparent member 41, the semiconductor imaging device 21 and the transparent adhesive 111 which constitute the semiconductor imaging apparatus 4 of this embodiment are the same as those in the semiconductor imaging apparatus 1 of the first embodiment and therefore the description thereof will be omitted.

In the semiconductor imaging apparatus 4 of this embodiment, a light shielding wall is formed of, for example, the heat hardening light shielding agent 274 so as to surround part of a side surface of the semiconductor imaging device 21 and adhesion part for connecting the transparent member 41 and the semiconductor imaging device 21. With use of the light shielding agent 274, not only a flare characteristic can be improved by light shielding but also adhesion strength between the semiconductor imaging device 21 and the transparent member 41 can be improved. Accordingly, the light, thin and small semiconductor imaging apparatus 4 in which a flare is prevented and which has excellent reliability can be achieved.

Fifth Embodiment

Figure 6:
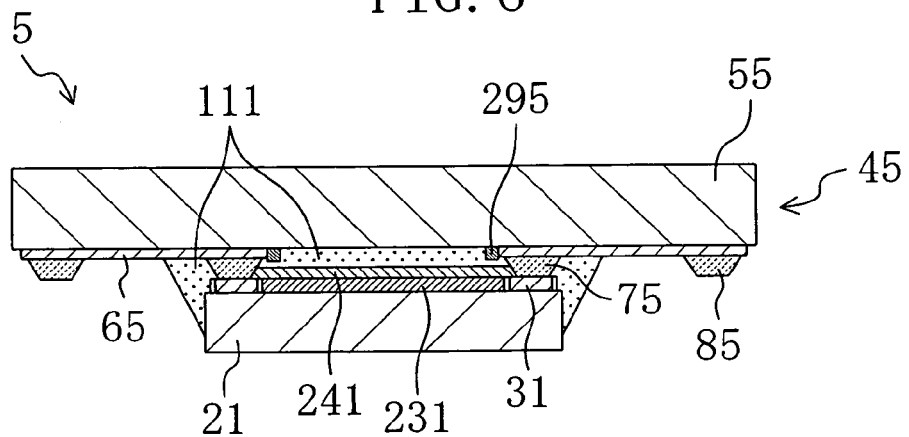
FIG. 6 is a cross-sectional view of a semiconductor imaging apparatus according to a fifth embodiment of the present invention.

FIG. 6 is a cross-sectional view of a semiconductor imaging apparatus 5 according to a fifth embodiment of the present invention. The semiconductor imaging apparatus 5 of FIG. 6 is characterized in that a light shielding agent 295 is provided so as to surround an imaging region of the semiconductor imaging device 21. Other part has the same structure as that of the first embodiment. Specifically, the semiconductor imaging apparatus 5 of this embodiment includes a transparent member 45, a semiconductor imaging device 21 and a transparent adhesive 111. This embodiment is characterized in that in the transparent member 45, a light shielding portion is formed of the light shielding agent 295 on part of a transparent substrate 55 corresponding to an imaging region in which the imaging device of the semiconductor imaging device 21 so as to surround the part.

The light shielding portion of the light shielding agent 295 is formed in or after the steps of forming conductive interconnects 65, protruding electrodes 75 and external connection electrodes 85 on a transparent member 45. For example, a resin material which is opaque to visible light is applied to the transparent member 45 and then a photoresist is applied thereon. Thereafter, light exposure and development are performed to form the photoresist into a predetermine pattern and then the applied resin material is etched using the photoresist film as a mask. Thus, a highly precise light shielding portion pattern can be obtained in a simple manner.

With the above-described structure, the light, thin and small semiconductor imaging apparatus 5 in which a flare is prevented and which has excellent reliability can be achieved.

Sixth Embodiment

Figure 7:
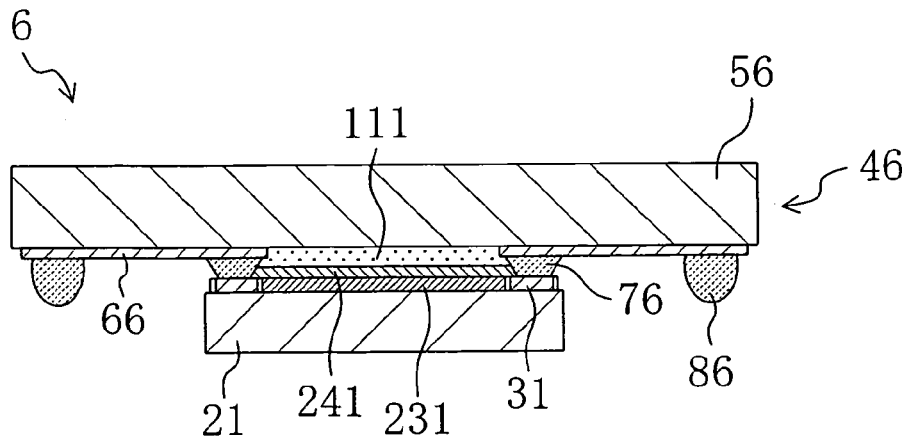
FIG. 7 is a cross-sectional view of a semiconductor imaging apparatus according to a sixth embodiment of the present invention.

FIG. 7 is a cross-sectional view of a semiconductor imaging device 6 according to a sixth embodiment of the preset invention. The semiconductor imaging device 6 of FIG. 7 is characterized in that external connection electrodes 86 is formed using a solder ball so that each of the external connection electrodes 86 is located on an edge portion of an associated one of conduction interconnects 66 arranged on one surface of a transparent member 46. Other part has the same structure as that of the first embodiment. As for materials and the like for a transparent substrate 56 used in the transparent member 46, the same materials and the like as those used for the transparent substrate 51 of the first embodiment can be used. Protruding electrodes 76 is formed so that each of the protruding electrodes 76 is located on the other end of the associated one of the conductive interconnects 66.

With the above-described structure using a solder ball, when a semiconductor imaging apparatus is mounted on a mounting substrate for the purpose of forming a semiconductor imaging module, the semiconductor imaging apparatus can be mounted on the substrate in a simple manner and a yield is fabrication can be increased.

Seventh Embodiment

Figure 8A:
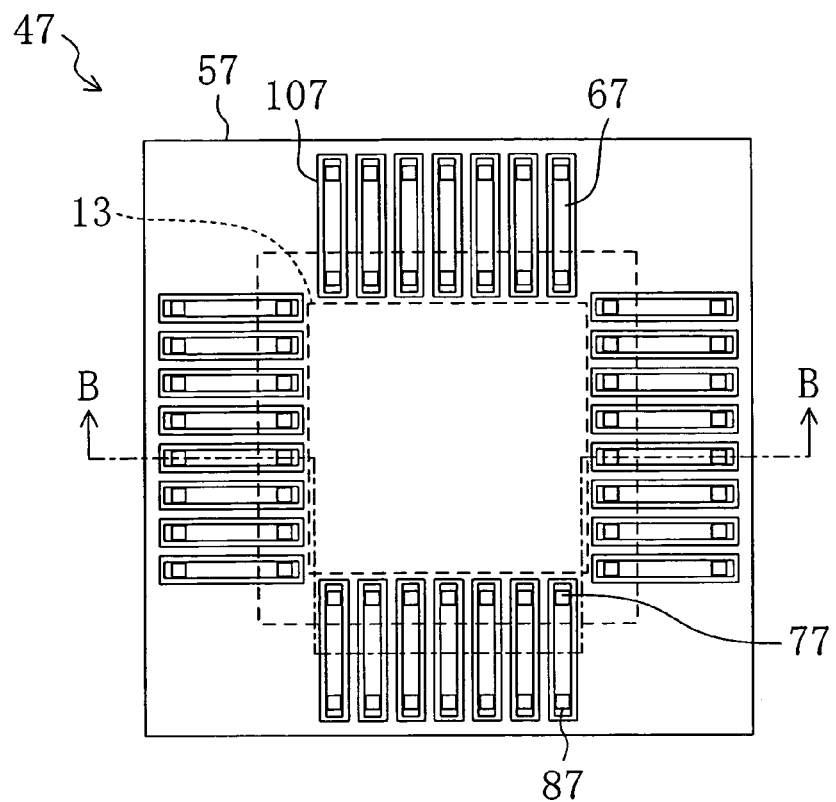
FIG. 8A is a plan view of a transparent member constituting a semiconductor imaging apparatus according to a seventh embodiment and FIG. 8B is a cross-sectional view taken along the line B-B of FIG. 8A.
Figure 8B:
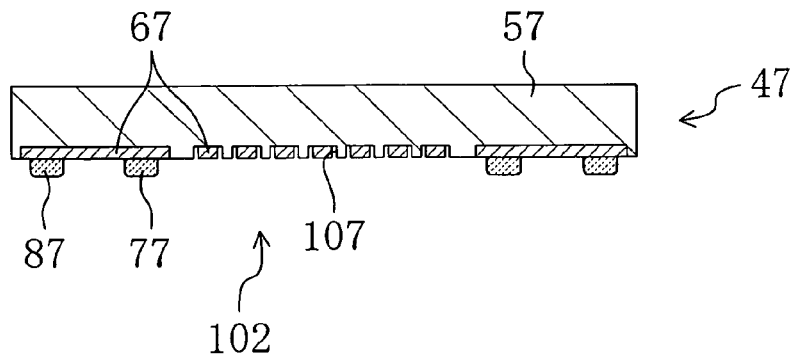

FIGS. 8A and 8B illustrate a transparent member 47 used in a semiconductor imaging apparatus according to a seventh embodiment. FIG. 8A is a plan view of transparent member 47 and the FIG. 8B is a cross-sectional view taken along the line B-B of FIG. 8A.

As shown in FIGS. 8A and 8B, the semiconductor imaging apparatus of this embodiment is characterized in that a projection plane of the transparent member 47 used in the semiconductor imaging apparatus has a rectangular shape and the transparent member 47 includes a transparent substrate 57, conductive interconnects 67, protruding electrodes 77 and external connection electrodes 87. The transparent substrate 57 includes grooves 107 each having a larger size than an associated one of the conductive interconnects 67 each of which is arranged on one surface of the transparent member 47 and a similar shape to a shape of each of the conductive interconnects 67. Each of the conductive interconnects 67 is arranged on a bottom surface of an associated one of the grooves 107. Each of the protruding electrodes 77 and an associated one of the external connection electrodes 87 are arranged on both end portions of an associated one of the conductive interconnects 67, respectively. Each of the grooves 107 is larger than an associated one of the conductive interconnects 67. Accordingly, when the conductive interconnects 67 are arranged on bottom surfaces of the grooves 107, respectively, the entire body of each of the conductive interconnects 67 fits in an associated one of the grooves 107.

The transparent member 47 includes the conductive interconnects 67 arranged on one surface of the transparent substrate 57 and the grooves 107 in which the conductive interconnects 67 are arranged on their bottom surfaces, respectively. The protruding electrodes 77 are arranged so that each of the protruding electrodes 77 is located on one end portion of an associated one of the conductive interconnects 67 and faces an associated one of electrodes provided on a semiconductor imaging device. The external connection electrodes 87 are arranged so that an associated one of the external connection electrodes 87 is located on the other end potion of the associated one of the conductive interconnects 67 and the external connection electrodes 87 are aligned along a circumference of the transparent substrate 57 with a predetermined space therebetween. The reference numeral 102 denotes an adhesion surface.

In the transparent substrate 57, a light passing through region 13 is formed in a center portion thereof. The light passing through region 13 has a larger area than an area of a photoreceptor region of the semiconductor imaging device 21. When the transparent substrate 57 is provided in the semiconductor imaging apparatus, the light passing through region 13 is located immediately above the semiconductor imaging device 21 so as to entirely cover the photoreceptor region of the semiconductor imaging device 21. Specifically, the light passing through region 13 is a region of the transparent substrate 57 surrounded by the protruding electrodes 77 or, in other words, a region of the transparent substrate 57 defined by lines connecting center side edges of the grooves 107. Note that in FIG. 8, in order to make the view easier to see, the light passing through region 13 is drawn smaller than an actual look in the region.

The semiconductor imaging apparatus using the transparent member 47 having the above-described structure, disconnection of the conductive interconnects 67 can be prevented, so that a light, thin and small semiconductor imaging device having an excellent reliability can be achieved. Therefore, a light, thin and small semiconductor imaging module having an excellent reliability can be achieved.

Eighth Embodiment

Figure 9:
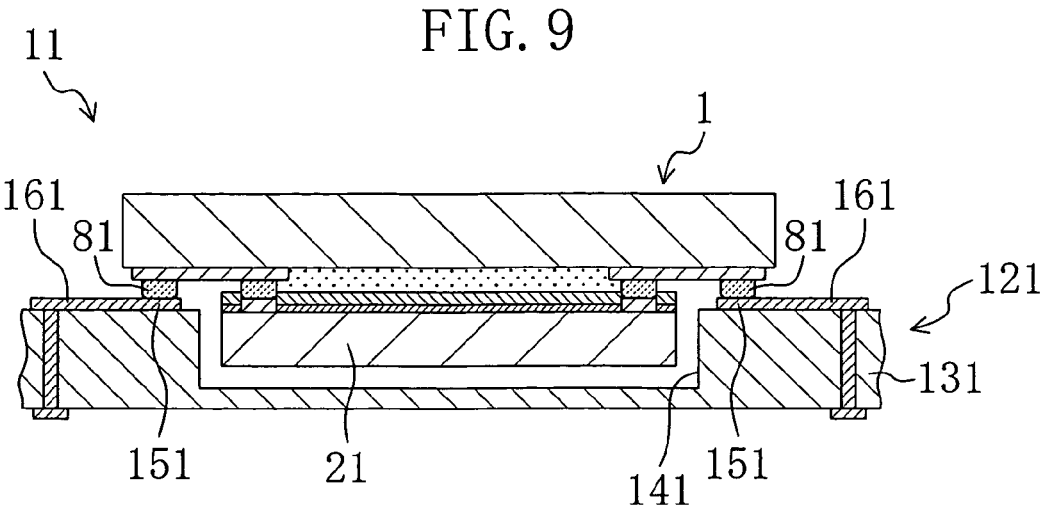
FIG. 9 is a cross-sectional view of a semiconductor imaging module according to an eighth embodiment of the present invention.

FIG. 9 is a cross-sectional view of a semiconductor imaging module (optical module) 11 according to an eighth embodiment of the present invention. The semiconductor imaging module 11 of this embodiment has a structure in which the semiconductor imaging apparatus 1 described in the first embodiment is mounted on the first mounting substrate 121.

The first mounting substrate 121 includes a recess portion 141 having at least a larger bottom area than that of the semiconductor imaging device 21 and a larger depth than a thickness of the semiconductor imaging device 21 in one surface of the first substrate 131. The almost entire semiconductor imaging device 21 fits in the recess portion 141. Moreover, each of first substrate terminals 151 on one end portion of an associated one of first substrate interconnects 161 is arranged so as to face an associated one of the external connection electrodes 81 provided on the transparent member 41 of the semiconductor imaging apparatus 1. The first substrate interconnects 161 are arranged with a predetermined space therebetween so that the other end portion of the associated one of the first substrate interconnects 161 is aligned along a circumference of the first substrate 131.

As a material of the first substrate 131, for example, any one of glass epoxy resin, aramid nonwoven fabric, polyimide resin, various kinds of ceramic and a metal plate including an insulating film on its surface can be used.

The semiconductor imaging module 11 of this embodiment can be fabricated in the following manner. The semiconductor imaging device 21 of the semiconductor imaging apparatus 1 is inserted into the recess portion 141 provided on one surface of the first substrate 131 constituting the first mounting substrate 121 so as to reach a point where the external connection electrodes 81 of the semiconductor imaging apparatus 1 make contact with the first substrate terminals 151 formed on the first substrate 131. While holding this state, alignment of the external connection electrodes 81 of the transparent member 41 and the first substrate terminals 151 on the first substrate 131 is performed. Then, the external connection electrodes 81 and the first substrate terminals 151 are heated and pressure is applied thereto, so that electrical connection is created and mechanical adhesion is achieved. The external connection electrodes 81 and the first substrate terminals 151 may be adhered through a solder connection or by a heat hardening conductive adhesive agent, or the like.

With the above-described structure, the light, thin and small semiconductor imaging module 11 can be achieved.

Even when the first mounting substrate 121 is used with any one of the semiconductor imaging apparatuses described in the second through seventh embodiments, a similar semiconductor imaging module to the above-described semiconductor imaging module can be constituted. The description of the similar semiconductor imaging module will be omitted.

Ninth Embodiment

Figure 10:
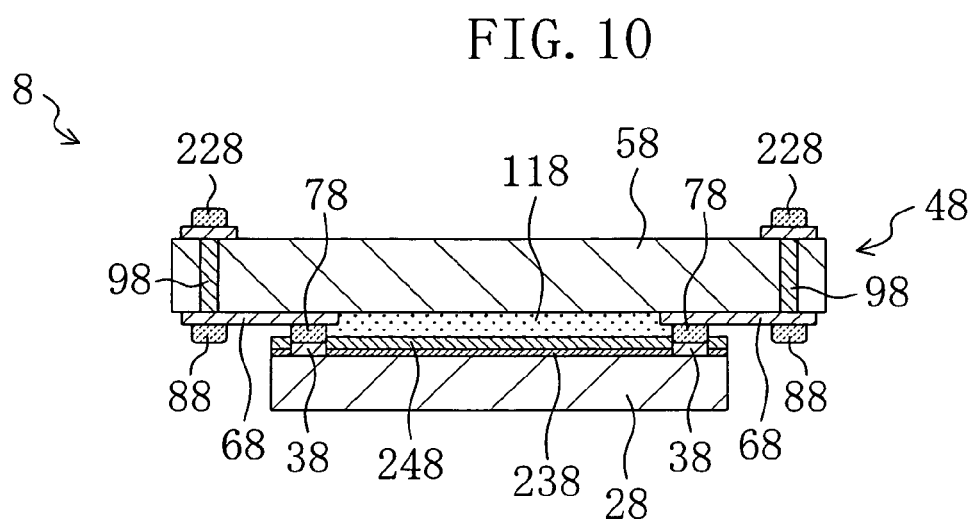
FIG. 10 is a cross-sectional view of a semiconductor imaging apparatus according to a ninth embodiment of the present invention.

FIG. 10 is a cross-sectional view of a semiconductor imaging apparatus (optical apparatus) 8 according to a ninth embodiment of the present invention. The semiconductor imaging apparatus 8 includes a transparent member 48, a semiconductor imaging device 28 and a transparent adhesive agent 118. A projection plane of the transparent member 48 has a rectangular shape.

The transparent member 48 includes conductive interconnects 68 on one surface of the transparent substrate 58. A protruding electrode 78 on one end potion of each of the conductive interconnects 68 is arranged so as to face an associated one of electrodes 38 of the semiconductor imaging device 28. Moreover, an external connection electrode 88 is located on the other end of each of the conductive interconnect 68 and a plurality of external connection electrodes 88 are arranged along a circumference of the transparent substrate 58 with a predetermined space therebetween. The external connection electrodes 88 are connected to through electrodes 98 provided on the transparent substrate 58, respectively. Through each of the through electrodes 98, an associated one of the external connection electrodes 88 is connected to an associated one of back surface electrodes 228 for secondary mounting provided on an opposite surface of the transparent substrate 58 to the surface thereof on which the conductive interconnects 68 are provided.

The size of projection plane of the transparent substrate 48 is at least larger than the semiconductor imaging device 28. The protruding electrodes 78 and the external connection electrodes 88 are formed so that all of the protruding electrodes 78 have the same height and the all of the external connection electrodes 88 have the same height. The protruding electrodes 78 and the external connection electrodes 88 may have the same height or different heights.

As a material for the transparent substrate 58, any one of a hard glass such as Pyrex glass, Terex glass, or the like, quartz, alumina glass, epoxy resin, acrylic resin, polyimide resin and the like may be used as long as the material is at least transparent to visible light. Moreover, in general, the conductive interconnects 68 are formed by vapor deposition, plating, printing or the like. A material for interconnects of a circuit substrate and the like which is usually used can be used without particular constraints. For example, a single body structure such as copper, nickel, gold, aluminum or the like or a laminated structure of these materials can be used. Moreover, in general, the protruding electrodes 78 and the external connection electrodes 88 are formed by a plating or wire bump method. As materials for the protruding electrodes 78 and the external connection electrodes 88, for example, gold, copper, or copper having a thin gold film on its surface can be used. However, materials and formation methods for the protruding electrodes 78 and the external connection electrodes 88 are not limited to those described above.

Furthermore, in general, the through electrodes 98 are formed so as to be buried by vapor deposition or printing. As a material for the through electrodes 98, gold, copper, some other metal material generally used in vapor deposition, or a material such as conductive paste used in printing can be used.

The conductive interconnects 68, the protruding electrodes 78, the external connection electrodes 88 and the back surface electrodes 228 may be formed in the following manner. That is, for example, after the metal film is formed by sputtering, the conductive interconnects 68 are formed using photolithography and then electroplating is performed to form the protruding electrodes 78, the external connection electrodes 88 and back surface electrodes 228 such that each of the protruding electrodes 78 and an associated one of the external connection electrodes 88 are located on both end portions of an associated one of the conductive interconnects 68 and the protruding electrodes 78, the external connection electrodes 88 and back surface electrodes 228 have a predetermined height.

The semiconductor imaging device 28 is formed so that its principal surface includes an imaging region (not shown), a peripheral circuit region (not shown) and an electrode region (not shown) and a microlens is formed on each pixel in the imaging region. Over the microlens, a laminated organic film of a transparent low-refractive index film 238 and a flattering film 248 is formed so as to entirely cover the principal surface except for electrodes 38 located in the electrode region. Note that these films may be formed only in the imaging region. For example, a nickel film or a lamination film of nickel and gold is formed on a surface of each of the electrode 38 made of, for example, aluminum, copper or the like by electroless plating or like method. Note that the surface of each of the substrates 38 does not have to be covered by nickel or the like as described above, but may be maintained to be aluminum.

The transparent adhesive agent 118 is made of liquid or half-hardened transparent resin having the characteristic of being hardened when being exposed to ultraviolet light or the characteristic of being hardened when being exposed to heat. As the transparent resin, any one of epoxy resin, acrylic resin and polyimide resin can be used. Note that the material for the transparent adhesive 118 is not limited to those materials but a material having transparency and adhesiveness can be used.

In the semiconductor imaging apparatus 8 of this embodiment, each of the protruding electrodes 78 formed on one surface of the transparent substrate 58 constituting the transparent member 48 and an associated one of the electrodes 38 of the semiconductor imaging device 28 are in contact with each other to create electrical connection, and the transparent substrate 58 and the semiconductor imaging device 28 are adhered and fixed to each other by the transparent adhesive 118 filled in a space between the transparent substrate 55 and the semiconductor imaging device 28. Specifically, after application of the transparent adhesive 118 to the entire principal surface of the semiconductor imaging device 28, electrical connection between each of the protruding electrodes 78 and an associated one of the electrodes 38 is created under the condition where the protruding electrodes 78 and the electrodes 38 are aligned and pressure is applied thereto, and is maintained by irradiating ultraviolet light to the transparent adhesive 118 from a back surface of the transparent substrate 58 (a surface on which the conductive interconnects 68 are not formed) to harden the transparent adhesive 118. Through this hardening, the transparent substrate 58 and the semiconductor imaging device 28 can be adhered to each other. Furthermore, after irradiation of ultraviolet light, the transparent adhesive 118 may be heated to accelerate hardening. Also, after the protruding electrodes 78 and the electrodes 38 have been aligned, the transparent adhesive 118 may be filled into a space between the transparent member 48 and the semiconductor imaging device 28 while pressure is applied thereto and then, in this condition, ultraviolet light may be irradiated to the transparent adhesive 111.

Note that each of the protruding electrodes 78 on an associated one of the conductive interconnects 68 arranged on the transparent substrate 58 and an associated one of the electrodes 38 on the semiconductor imaging device 28 may be adhered by a conductive adhesive or soldered connection method, an ultrasound connection method, or like method.

With the above-described structure, another mounting substrate may be mounted also on the opposite surface of the transparent member 48 to the surface thereof on which the semiconductor imaging device 28 is mounted. Accordingly, not only the density of functions of the semiconductor imaging module can be increased but also design freedom for increase in the density can be improved. Furthermore, the light, thin and small semiconductor imaging apparatus 8 can be achieved.

Tenth Embodiment

Figure 11:
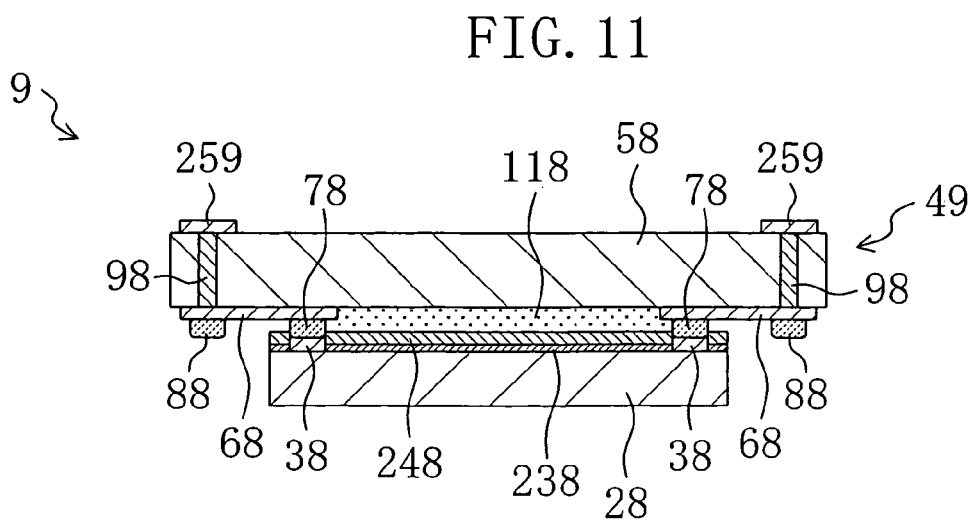
FIG. 11 is a cross-sectional view of a semiconductor imaging apparatus according to a tenth embodiment of the present invention.

FIG. 11 is a cross-sectional view of a semiconductor imaging apparatus 9 according to a tenth embodiment of the present invention. The semiconductor imaging apparatus 9 of this embodiment is characterized in that the protruding back surface electrodes 228 provided on the transparent member 48 used in the semiconductor imaging apparatus 8 of the ninth embodiment are replaced with flat back surface electrodes 259. Structures and materials for other part are the same as those of the semiconductor imaging apparatus 8 of the ninth embodiment and therefore the description thereof will be omitted. This structure can be formed.

Note that any one of the structures described in the second through seventh embodiments may be applied to a transparent member in each of the semiconductor imaging apparatus 8 of the ninth embodiment and the semiconductor imaging apparatus 9 of the tenth embodiment. With application of such structures, the same effects described in the first embodiment can be achieved.

Eleventh Embodiment

Figure 12:
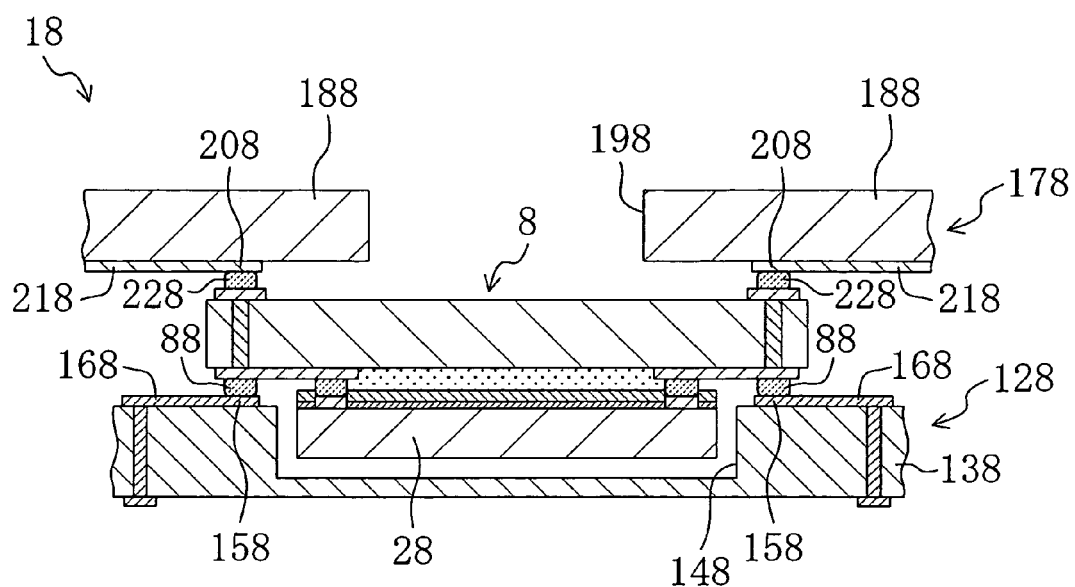
FIG. 12 is a cross-sectional view of a semiconductor imaging module according to an eleventh embodiment of the present invention.

FIG. 12 is a cross-sectional view of a semiconductor imaging module (optical module) 18 according to an eleventh embodiment of the present invention. The semiconductor imaging module 18 of FIG. 12 has a structure in which the semiconductor imaging apparatus 8 of the ninth embodiment is mounted as to be in contact with both of a first mounting substrate 128 and a second mounting substrate 178.

The first mounting substrate 128 includes a recess portion 148 having at least a larger bottom area than that of a semiconductor imaging device 28 and a larger depth than a thickness of the semiconductor imaging device 28 in one surface of the first substrate 138. A plurality of first substrate interconnects 168 are formed in a periphery portion of the recess portion 148. Moreover, a first substrate terminal 158 is provided on one end of each of the first substrate interconnects 168 so as to correspond to an associated one of the external connection electrodes 88 provided on the transparent member 48 of the semiconductor imaging apparatus 8. A plurality of first substrate interconnects 168 are arranged with a predetermined distance therebetween so that the other end portion of each of the first substrate interconnects 168 is aligned along a circumference of the first substrate 138.

As a material of first substrate 138, for example, any one of glass epoxy resin, aramid nonwoven fabric, polyimide resin, various kinds of ceramic and a metal plate including an insulating film on its surface can be used.

The second mounting substrate 178 includes a through hole 198 passing through a second substrate 188 and second substrate interconnects 218 are formed on one surface of the second substrate 188 so as to be located around the through hole 198. Second substrate terminals 208 are provided on the same surface of the second mounting substrate 178 as the second substrate interconnects 218 are provided. Each of the second substrate terminals 208 is arranged on one end of an associated one of the second substrate interconnects 218 so as to correspond to an associated one of back surface electrodes 228 formed on the transparent substrate 48 of the semiconductor imaging apparatus 8. The second substrate interconnects 218 are arranged with a predetermined distance therebetween. The other end of each of the second substrate interconnects 218 is arranged so as to be aligned to a circumference of the second substrate 188. Furthermore, an opening dimension of the through hole 198 in the second substrate 188 is set so that a projection plane of the through hole 198 is equal to or larger than an imaging region of the semiconductor imaging device 28. That is, light through the through hole 198 enters at least the entire imaging region of the semiconductor imaging device 28.

As a material of the second substrate 188, for example, any one of glass epoxy resin, aramid nonwoven fabric, polyimide resin, various kinds of ceramic and a metal plate including an insulating film on its surface can be used.

The semiconductor imaging module 18 of this embodiment can be fabricated in the following manner. The semiconductor imaging device 28 is inserted into the recess portion 148 provided in one surface of the first substrate 138 constituting the first mounting substrate 128 so as to reach a point where the external connection electrodes 88 of the semiconductor imaging apparatus 8 make contact with the first substrate terminals 158 formed on the first substrate 138. While holding this state, alignment of the external connection electrodes 88 of the transparent member 48 and the first substrate terminals 158 on the first substrate 138 is performed. Then, the external connection electrodes 88 and the first substrate terminals 158 are heated and pressure is applied thereto, so that electrical connection is created and mechanical adhesion is achieved. The external connection electrodes 88 and the first substrate terminals 158 may be adhered through a solder connection or by a heat hardening conductive adhesive agent, or the like.

Next, the second substrate terminals 208 formed on the second substrate 188 constituting the second mounting substrate 178 and the back surface electrodes 228 provided on the transparent member 48 are aligned and brought into contact, respectively. In this case, alignment is performed so that the imaging region of the semiconductor imaging device 28 of the semiconductor imaging apparatus 8 is not shielded by a frame portion of the through hole 198. While holding this state, each of the back surface electrodes 228 and an associated one of the second substrate terminals 208 are adhered to each other.

The first mounting substrate 128 and the semiconductor imaging apparatus 8 may be adhered through a solder connection or by a heat hardening conductive adhesive agent, or the like. Moreover, the semiconductor imaging apparatus 8, the first mounting substrate 128 and the second mounting substrate 178 may be adhered at the same time in the same manner as described above.

With the above-described structure, the high-density, light, thin and small semiconductor imaging module 18 can be achieved. Moreover, when the semiconductor imaging module 18 is fabricated so as to have a structure including two mounting substrates, for example, the mounting substrates can be separately used so that one of the mounting substrate is used for a power source line and a ground line and the other one can be used for a signal line. When the structure including two mounting substrates is formed using the semiconductor imaging apparatus 8 of FIG. 10, different interconnect patterns are formed for the first substrate interconnects 168 of the first mounting substrate 128 and the second substrate interconnects 218 of the second mounting substrate 178, respectively. For example, when each of the second substrate interconnects 218 which are ground lines of the second mounting substrate 178 is connected to an associated one of the back surface electrodes 228, the first substrate interconnects 168 which are connected to the external connection electrodes 88 and correspond to the second substrate interconnects 218 are not formed. Thus, ground lines and power source lines can be freely provided so as to be isolated from one another and be connected to a semiconductor imaging device by pattern design of the conductive interconnects 168 of the first mounting substrate 128 and the conductive interconnects 218 of the second mounting substrate 178.

Note that the external connection electrodes 88 and the back surface electrodes 228 may be formed so as to be electrically separated from one another in the step of forming the transparent member 48. Such an interconnect structure also falls within the scope of the present invention.

Twelfth Embodiment

Figure 13:
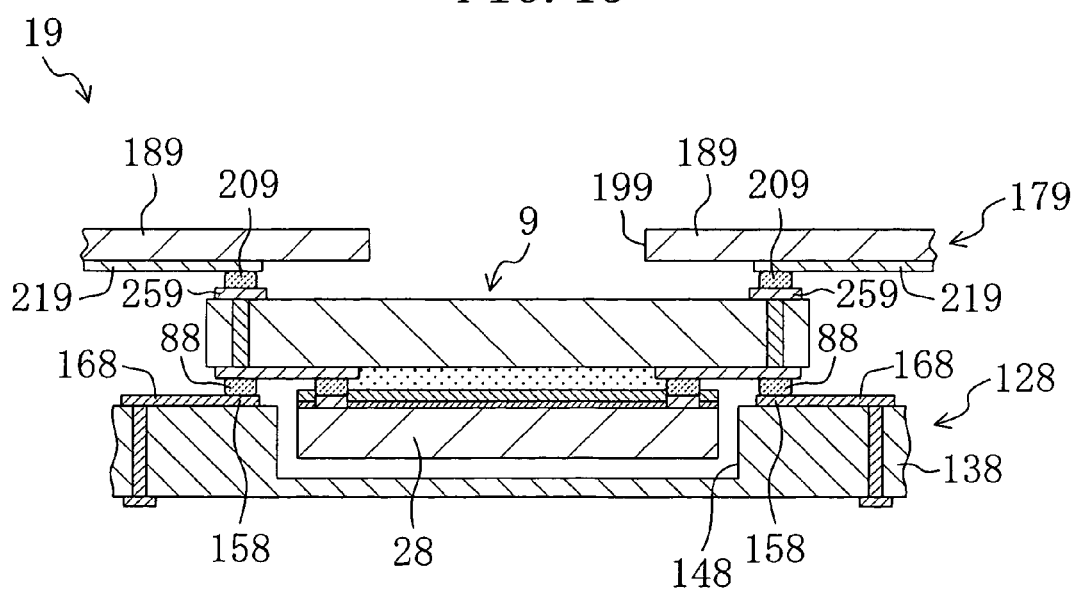
FIG. 13 is a cross-sectional view of a semiconductor imaging module according to a twelfth embodiment of the present invention.

FIG. 13 is a cross-sectional view of a semiconductor imaging module 19 according to a twelfth embodiment of the present invention. The semiconductor imaging module 19 is characterized in that the semiconductor imaging module 19 is fabricated using a modified example of the semiconductor imaging apparatus 9 of the tenth embodiment and has a structure using a flexible second mounting substrate 179. Other than that, the twelfth embodiment is the same as the eleventh embodiment.

The second mounting substrate 179 is obtained by forming a second substrate 189 into a flexible form using a polyimide resin or polyester. The second mounting substrate 179 has a through hole 199 passing through the second substrate 189 and second substrate interconnects 219 are formed on one surface of the second substrate 189 so as to be located around the through hole 199. Second substrate terminals 209 are provided so that each of the second substrate terminals 209 is arranged on one end of an associated one of the second substrate interconnects 219 so as to correspond to an associated one of back surface electrodes 259 formed on the transparent substrate 49 of the semiconductor imaging apparatus 9. The second substrate interconnects 219 are provided with a predetermined distance therebetween so that the other end of each of the second substrate interconnects 219 is arranged so as to be aligned to a circumference of the second substrate 189. Furthermore, an opening dimension of the through hole 199 in the second substrate 189 is set so that a projection plane of the through hole 199 is at least equal to or larger than an imaging region of the semiconductor imaging device 28.

Structures and materials for other part are the same as those of the second mounting substrate 178 of the eleventh embodiment and therefore the description thereof will be omitted.

By forming the above-described structure, the semiconductor imaging module 19 of this embodiment having a structure including two mounting substrates can be achieved. Accordingly, the two mounting substrates can be separately used so that one of the mounting substrates is used for power source lines and ground lines and the other one is used for signal lines. Furthermore, with use of a flexible material for the second mounting substrate 179, the degree of freedom of a storage space in electric equipment for storing the semiconductor imaging module 19 can be increased. Moreover, the light, thin and small semiconductor imaging module 19 can be achieved.

Note that any one of the structures descried in the second through seventh embodiments may be applied to a transparent member in each of the semiconductor imaging apparatus 8 and the modified example of the semiconductor imaging apparatus 9 described in the eleventh and twelfth embodiments. With application of such structures, a semiconductor imaging module may be fabricated using the first mounting substrate and the second mounting substrate described in the eleventh and twelfth embodiments.

Thirteenth Embodiment

Figure 14:
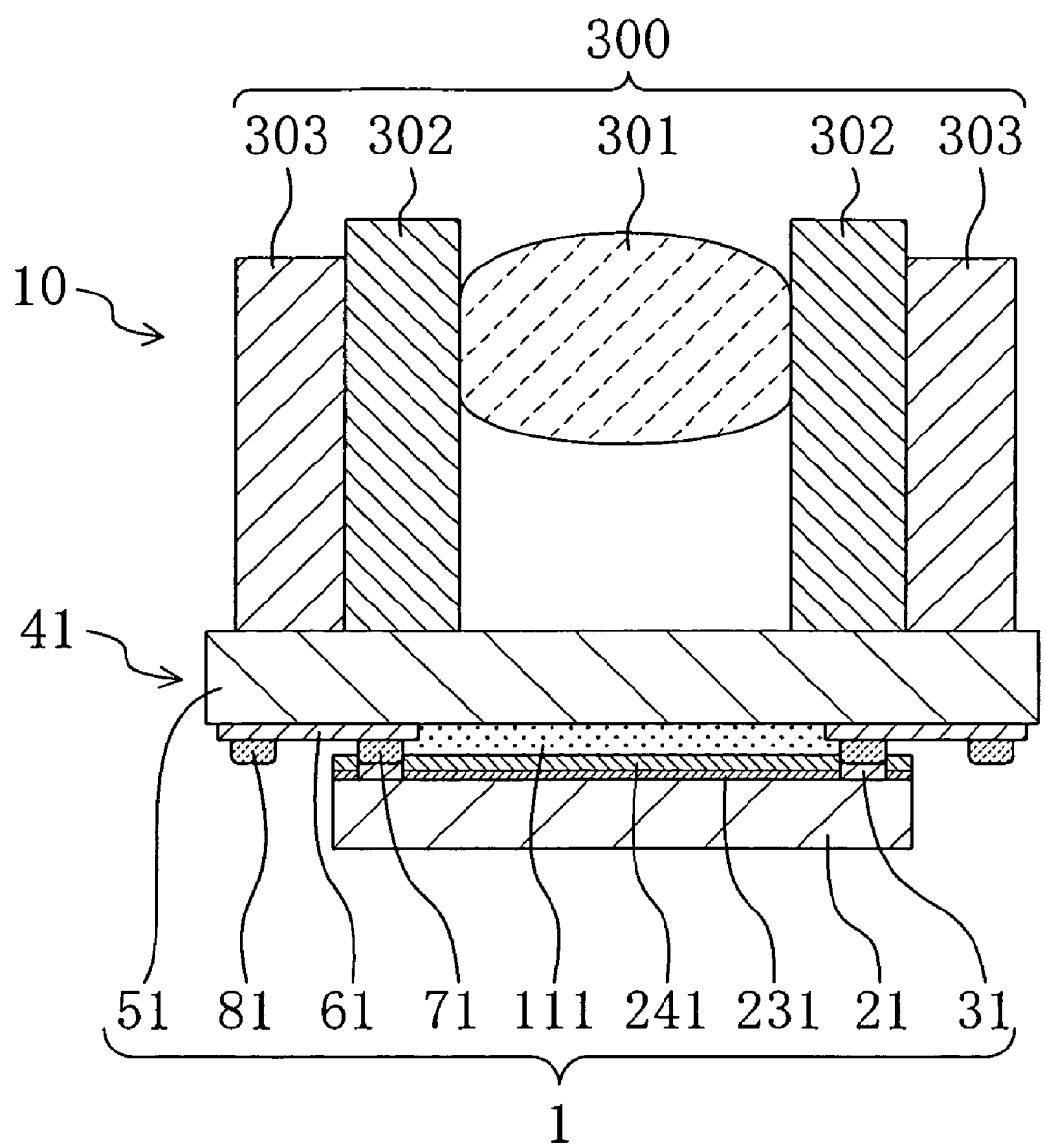
FIG. 14 is a cross-sectional view of a semiconductor imaging apparatus according to a thirteenth embodiment of the present invention.

FIG. 14 is a cross-sectional view of a semiconductor imaging apparatus 10 according to a thirteenth embodiment of the present invention. The semiconductor imaging apparatus 10 is characterized in that a lens module 300 in which a lens 301 is attached to a lens holder 302 is further provided on an opposite surface of the transparent member 41 in the semiconductor imaging apparatus 1 described in the first embodiment to a surface thereof on which a semiconductor imaging device is mounted. In the lens module 300, the lens 301 is attached so that an optical axis corresponds to an imaging region of the semiconductor imaging device 21. The lens module 300 includes a lens barrel 303, the lens holder 302 provided in the lens barrel 303 and the lens 301 fixed to the lens holder 302. The lens module 300 is a fixed focus type and, for example, is used for a cellular phone and the like.

In this embodiment, for example, when a glass substrate is used as the transparent substrate 51 of the transparent member 41, optical axis alignment and like process step in attaching the lens module 300 can be performed in a simple manner, so that the transparent substrate 51 and the lens module 300 can be fixedly adhered. That is, the semiconductor imaging device 21 can be mounted on the glass substrate which is the transparent substrate 51 with high accuracy so that an imaging region of the semiconductor imaging device 21 is arranged in parallel to the glass substrate. Moreover, the glass substrate has very good uniformity and therefore the lens module 300 can be adhered precisely in parallel to the glass substrate. Also, optical axis alignment can be achieved in a simple manner. With this structure, even if the lens module 300 is mounted on the semiconductor imaging apparatus 10, the entire semiconductor imaging apparatus 10 can be formed to be thin.

Note that the lens module 300 may be installed to any one of the semiconductor imaging apparatuses described in the second through seventh embodiments in the same manner as described in this embodiment, so that the lens module 300 is mounted on the opposite surface of the transparent substrate to the surface thereof on which the semiconductor imaging apparatus is mounted.

Fourteenth Embodiment

Figure 15:
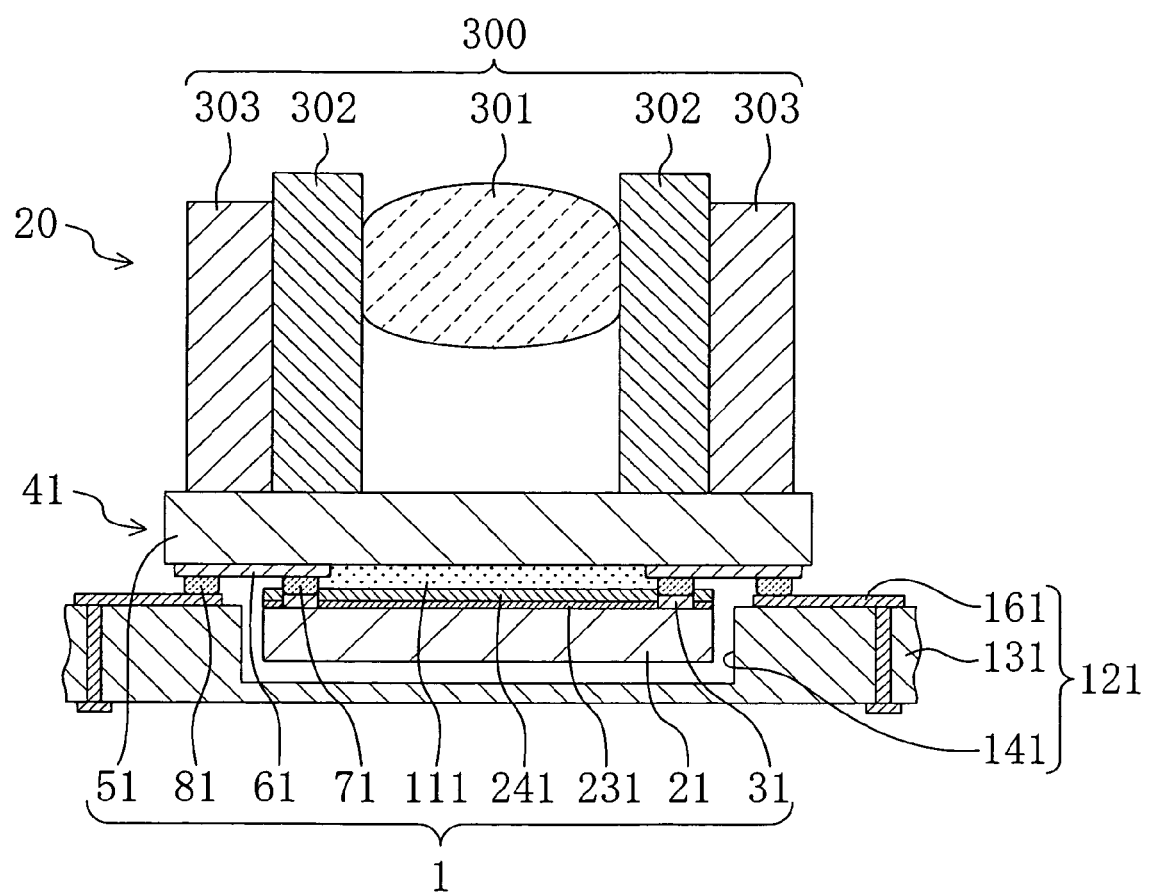
FIG. 15 is a cross-sectional view of a semiconductor imaging module according to a fourteenth embodiment of the present invention.

FIG. 15 is a cross-sectional view of a semiconductor imaging module 20 in which the semiconductor imaging apparatus 10 of FIG. 14 is mounted on the first mounting substrate 121. In this embodiment, the first mounting substrate 121 described in the eighth embodiment is used and therefore the description thereof will be omitted. Moreover, the step of fabricating the semiconductor imaging module 20 of this embodiment can be performed in the same manner as described in the eighth embodiment and therefore the description of the fabrication process step will be omitted.

To the semiconductor imaging module 20, a lens module 300 can be installed with high accuracy by a simple process step. Furthermore, the semiconductor imaging device 21 is arranged inside the recess portion 141 of the first mounting substrate 121 and external connection electrodes and first substrate terminals 151 of the first mounting substrate 121 are connected, respectively, by a flip chip method. Thus, even if the lens module 300 is mounted on the semiconductor imaging apparatus 20, the entire semiconductor imaging apparatus 20 can be formed to be thin, compared to the known structure.

Therefore, the present invention has great effects especially in the field of, for example, cellular phone which requires a thin semiconductor imaging module.

Furthermore, in this embodiment, the structure in which the recess portion 141 is provided in the first mounting substrate 121 and the semiconductor imaging device 21 is inserted in the recess portion 141 is used. However, the present invention is not limited to this structure. For example, a first mounting substrate in which an opening portion which is at least larger than a semiconductor imaging device is formed in a first substrate, first substrate terminals arranged around the opening so as to correspond to protruding electrodes of the semiconductor imaging device, respectively, and first substrate interconnects each of which connects an associated one of the first substrate terminals and an external circuit section may be used. The semiconductor imaging apparatus 10 of this embodiment may be mounted on the first mounting substrate having the above-described structure to form a semiconductor imaging module.

When a motor, a sensor or the like is installed in a lens module, the lens module may be mounted on an opposite surface of a transparent substrate to a surface thereof on which a semiconductor imaging device is mounted in a semiconductor imaging apparatus including a transparent member in which through electrodes described in the ninth embodiment are provided. In this case, electrode terminals of electric part such as a motor or the like of the lens module may be connected to back electrodes, for example, through solder connection or the like. If as the back electrodes are connected to external connection electrodes via the through electrodes, respectively, the motor or the like can be controlled by a circuit formed on the first mounting substrate.

Moreover, in the above-described embodiments, a photoreceptor region is shown only in FIG. 2 and FIG. 8 of the first embodiment. However, a photoreceptor region exists in a transparent member according to each of embodiments and modified examples of the present invention. A photoreceptor region is a region surrounded by protruding electrodes and defined by lines connecting center side edges of conductive interconnects on a surface of a transparent substrate.

Moreover, in each of the above-described embodiments, a LED device may be used, instead of a semiconductor imaging device. Alternatively, some other optical device for receiving or emitting light may also be used, instead of an optical imaging device. In this case, the structures and functions of a transparent member and first and second mounting substrates are the same as those of the transparent member and first and second mounting substrates described in each of the above-described embodiments.

The optical module using an optical apparatus according to the present invention has great effects of allowing fabrication of a light, thin and small semiconductor imaging apparatus and semiconductor imaging module which has excellent optical characteristics and quality at low cost.

What is claimed is:

1. An optical apparatus comprising:
    an optical device including a photoreceptor region or a light emitting region and electrodes provided on an optical function surface;
    a transparent member having an adhesion surface having a larger area than an area of the optical function surface and including protruding electrodes electrically connected to the optical device, external connection electrodes and conductive interconnects for connecting the protruding electrodes and the external connection electrodes, respectively; and
    a transparent adhesive provided between the optical device and the transparent member to adhere the optical device and the transparent member to each other,
    wherein the optical function surface of the optical device and the adhesion surface of the transparent member face each other,
    the electrodes and the protruding electrodes are electrically connected, respectively, and the electrical connection is maintained by the transparent adhesive, and
    the external connection electrodes on the adhesion surface have substantially the same height as the protruding electrodes on the adhesion surface.

2. The optical apparatus of claim 1, wherein the optical device is a semiconductor imaging device, and
    the semiconductor imaging device includes a peripheral circuit region, an electrode region in which the electrodes are arranged and an imaging region which is the photoreceptor region.

3. The optical apparatus of claim 1, wherein a loop shape groove is formed in the adhesion surface of the transparent member so as to surround part of the adhesion surface corresponding to a circumference of the optical device, and
    the conductive interconnects are formed so that each said conductive interconnect crosses the loop shape groove.

4. The optical apparatus of claim 3, wherein each said loop shape groove has a smaller width at a bottom portion than at an opening potion and each side wall of the loop shape groove extending from the opening portion to the bottom portion has a slope shape or a step-like shape.

5. The optical apparatus of claim 1, wherein a loop shape groove is formed in the adhesion surface of the transparent member so as to surround part of the adhesion surface corresponding to a circumference of the optical device, and
    a light shielding material is filled in the loop shape groove.

6. The optical apparatus of claim 5, wherein the loop shape groove has a smaller width at a bottom portion than at an opening potion and each side wall of the loop shape groove extending from the opening portion to the bottom portion has a slope shape or a step-like shape.

7. The optical apparatus of claim 1, wherein grooves are provided in the adhesion surface of the transparent member so that each said groove has an opening having a similar shape to the shape of each said conductive interconnect and a larger size than a size of each said conductive interconnect, and
    the conductive interconnects are formed so as to be provided in the grooves, respectively.

8. The optical apparatus of claim 1, further comprising, on an opposite surface of the transparent member to the adhesion surface, a lens module including a lens holder and a lens attached to the lens holder, and
    an optical axis of the lens substantially matches with an optical axis of the photoreceptor region or the light emitting region of the optical device.

9. An optical module comprising:
    the optical apparatus of claim 1; and
    a first mounting substrate on which the optical apparatus is mounted, the first mounting substrate including a first substrate,
    wherein a recess portion having a larger area than an area of the optical device and a larger depth than a thickness of the optical device, first substrate terminals arranged around the recess portion and first substrate interconnects for electrically connecting the first substrate terminals to an external circuit are provided on one surface of the first substrate,
    at least part of the optical device is inserted in the recess portion, and the first substrate terminals are arranged so as to correspond to the external connection electrodes, respectively, and are connected to the external connection electrodes, respectively.

10. An optical apparatus comprising:
an optical device including a photoreceptor region or a light emitting region and electrodes provided on an optical function surface;
a transparent member having an adhesion surface having a larger area than an area of the optical function surface and including protruding electrodes electrically connected to the optical device, external connection electrodes and conductive interconnects for connecting the protruding electrodes and the external connection electrodes, respectively; and
a transparent adhesive provided between the optical device and the transparent member to adhere the optical device and the transparent member to each other,
wherein in the transparent member, the protruding electrodes, the external connection electrodes and the conductive interconnects are provided on one surface of the transparent member, and the transparent member further includes, on the other surface, back surface electrodes electrically connected to the external connection electrodes via through electrodes provided in the transparent substrate so as to pass through the transparent substrate, respectively,
the optical function surface of the optical device and the adhesion surface of the transparent member face to each other, and
the electrodes and the protruding electrodes are electrically connected, respectively, and the electrical connection is maintained by the transparent adhesive.

11. The optical apparatus of claim 10, wherein the optical device is a semiconductor imaging device, and
the semiconductor imaging device includes a peripheral circuit region, an electrode region in which the electrodes are arranged and an imaging region which is the photoreceptor region.

12. The optical apparatus of claim 10, wherein a loop shape groove is formed in the adhesion surface of the transparent member so as to surround part of the adhesion surface corresponding to a circumference of the optical device, and
the conductive interconnects are formed so that each said conductive interconnect crosses the loop shape groove.

13. The optical apparatus of claim 12, wherein the loop shape groove has a smaller width at a bottom portion than at an opening potion and each side wall of the groove extending from the opening portion to the bottom portion has a slope shape or a step-like shape.

14. The optical apparatus of claim 10, wherein a loop shape groove is formed in the adhesion surface of the transparent member so as to surround part of the adhesion surface corresponding to a circumference of the optical device, and
a light shielding material is filled in the loop shape groove.

15. The optical apparatus of claim 14, wherein the loop shape groove has a smaller width at a bottom portion than at an opening potion and each side wall of the groove extending from the opening portion to the bottom portion has a slope shape or a step-like shape.

16. The optical apparatus of claim 10, wherein grooves are provided in the adhesion surface of the transparent member so that each said groove has an opening having a similar shape to the shape of each said conductive interconnect and a larger size than a size of each said conductive interconnect, and
the conductive interconnects are formed so as to be provided in the grooves, respectively.

17. An optical module comprising:
the optical apparatus of claim 10;
a first mounting substrate on which the optical apparatus is mounted, the first mounting substrate including a first substrate; and
a second mounting substrate arranged so as to face the first mounting substrate with the optical apparatus interposed therebetween, the second mounting substrate including a second substrate,
wherein in the first substrate, a recess portion having a larger area than an area of the optical device and a larger depth than a thickness of the optical device, first substrate terminals arranged around the recess portion and first substrate interconnects for electrically connecting the first substrate terminals to an external circuit are provided on one surface of the first substrate,
at least part of the optical device is inserted in the recess portion, and
the first substrate terminals are arranged so as to correspond to the external connection electrodes, respectively, and are connected to the external connection electrodes, respectively,
in a second substrate, a through opening having an area equal to or larger than an area of the photoreceptor region or the light emitting region of the optical device, second substrate terminals arranged around the through opening and second substrate interconnects for electrically connecting the second substrate terminals to an external circuit are provided,
a frame of the through opening is located so as to correspond to a circumference of the photoreceptor region or the light emitting region or the outside of the circumference in the optical device, and
the substrate terminals are arranged so as to correspond to the back surface electrodes, respectively, and are connected to the back surface electrodes, respectively.

18. The optical module of claim 17, wherein the second substrate of the second mounting substrate is formed of a flexible material.

19. The optical module of claim 17, wherein the optical device is a LED.

* * * * *